United States Patent

Kawai et al.

Patent Number: 5,863,811
Date of Patent: Jan. 26, 1999

[54] METHOD FOR GROWING SINGLE CRYSTAL III-V COMPOUND SEMICONDUCTOR LAYERS ON NON SINGLE CRYSTAL III-V COMPOUND SEMICONDUCTOR BUFFER LAYERS

[75] Inventors: Hiroji Kawai; Tsunenori Asatsuma; Kenji Funato, all of Kanagawa, Japan

[73] Assignee: Sony Corporation, Tokyo, Japan

[21] Appl. No.: 672,042

[22] Filed: Jun. 26, 1996

[30] Foreign Application Priority Data

Jun. 28, 1995  [JP]  Japan ................... 7-184740

[51] Int. Cl.$^6$ ................... H01L 21/20
[52] U.S. Cl. ............... 438/47; 438/479; 438/483; 438/503; 148/DIG. 25; 148/DIG. 113
[58] Field of Search ............... 438/46, 47, 479, 438/483, 503, 509, 507, 264, 267, 268, 293; 148/DIG. 25, DIG. 113; 257/76, 94, 96, 201, 615

[56] References Cited

U.S. PATENT DOCUMENTS

| | | | |
|---|---|---|---|
| 4,855,249 | 8/1989 | Akasaki et al. | 148/DIG. 25 |
| 5,290,393 | 3/1994 | Nakamura | 438/46 |
| 5,306,662 | 4/1994 | Nakamura et al. | 438/509 |
| 5,578,839 | 11/1996 | Nakamura et al. | 257/201 |
| 5,602,418 | 2/1997 | Imai et al. | 257/96 |
| 5,656,832 | 8/1997 | Ohba et al. | 257/96 |
| 5,665,986 | 9/1997 | Miura et al. | 257/201 |

FOREIGN PATENT DOCUMENTS 6-151962  5/1994  Japan .
6-196757  6/1994  Japan .

Primary Examiner—Charles L. Bowers, Jr.
Assistant Examiner—Leon Radomsky
Attorney, Agent, or Firm—Hill & Simpson

[57] ABSTRACT

A method for growing a single crystal III–V compound semiconductor layer, in which grown by vapor deposition on a first single crystal III–V compound semiconductor layer including at least Ga and N is a second single crystal III–V compound semiconductor layer different from the first layer and including at least Ga and N, comprises the steps of: growing a buffer layer other than single crystal and having substantially the same composition as that of the second layer by vapor deposition on the first layer; and growing the second layer on the buffer layer. A method for growing a single crystal AlGaN layer on a single crystal GaN layer by vapor deposition, comprises the steps of: growing a buffer layer of a III–V compound semiconductor including at least Ga and N on the single crystal GaN layer by vapor deposition; and growing the single crystal AlGaN layer on the buffer layer by vapor deposition. A method for growing single crystal III–V compound semiconductor layers, in which a first single crystal III–V compound semiconductor layer including at least Ga and N and a second single crystal III–V compound semiconductor layer different from the first layer and including at least Ga and N are grown on a substrate by vapor deposition, comprises the step of: growing a buffer layer of a III–V compound semiconductor including at least Ga and N between the first layer and the second layer.

12 Claims, 3 Drawing Sheets

100μm

100μm

METHOD FOR GROWING SINGLE CRYSTAL III-V COMPOUND SEMICONDUCTOR LAYERS ON NON SINGLE CRYSTAL III-V COMPOUND SEMICONDUCTOR BUFFER LAYERS

BACKGROUND OF THE INVENTION

1. Field of the Invention

This invention relates to a method for growing single crystal III–V compound semiconductor layers and, in particular, single crystal III–V compound semiconductor layers of nitrides.

2. Related Art

In recent years, attention has been directed to III–V compound semiconductors of nitrides such as GaN, AlGaN and GaInN because they have forbidden band widths ranging from 1.8 eV to 6.2 eV and theoretically promise light emitting devices capable of emitting red light to ultraviolet rays.

A light emitting diode (LED) or a semiconductor laser using III–V compound semiconductors of nitrides is made by stacking a plurality of layers of AlGaN, GaInN, GaN, etc. into a multilayered structure. The multilayered structure requires that respective layers have good crystalline properties and good surface conditions.

However, it is difficult to grow a single crystal layer of a desired thickness with no defect because the lattice constants of AlGaN, GaInN, GaN and other III–V compound semi-conductors of nitrides are largely different from each other unlike AlGaAs/GaAs semiconductors. In other words, when the thickness of growth exceeds a given value, there is no way to prevent defects produced in the crystal and deterioration in the crystalline property and the surface conditions. Taking an example where an AlN layer is grown on a GaN layer, since lattice constants of AlN and GaN in a-axis directions are different by 3%, the theoretical thickness of single crystal that can be grown without defects is only about 20 nm, and any larger thickness accompanies defects in the crystal and results in deterioration of the crystalline property and the surface condition.

This issue is reviewed taking a practical example where an $Al_{0.15}Ga_{0.85}N$ layer was grown on a GaN layer. Observing its surface through an optical microscope, a cross-hatched pattern was recognized on the $Al_{0.15}Ga_{0.85}N$ layer stacked up to a thickness around 300 nm. This aspect is shown in FIG. 2B. The cross-hatched pattern is made by cracks in the $Al_{0.15}Ga_{0.85}N$ layer caused by tensile forces applied thereto due to a difference between lattice constants of the GaN layer and the $Al_{0.15}Ga_{0.85}N$ layer. Cracks in grown layers in a light emitting device having a waveguide structure are a cause of optical reflection and deterioration of the device.

OBJECT AND SUMMARY OF THE INVENTION

It is therefore an object of the invention to provide a method for growing one or more high-quality single crystal III–V compound semiconductor layers of nitrides on an underlying single crystal III–V compound semiconductor layer of a nitride even when a large difference in lattice constant exists between upper and lower layers.

According to a first aspect of the invention, there is provided a method for growing a single crystal III–V compound semiconductor layer, in which grown by vapor deposition on a first single crystal III–V compound semiconductor layer including at least Ga and N is a second single crystal III–V compound semiconductor layer different from the first single crystal III–V compound semiconductor layer and including at least Ga and N, comprising the steps of:

growing a buffer layer other than single crystal and having substantially the same composition as that of the second single crystal III–V compound semiconductor layer by vapor deposition on the first single crystal III–V compound semiconductor layer; and growing the second single crystal III–V compound semiconductor layer on the buffer layer.

The buffer layer made in the first aspect of the invention is grown at a temperature lower than that for growing the second single crystal III–V compound semiconductor layer.

According to a second aspect of the invention, there is provided a method for growing a single crystal AlGaN layer on a single crystal GaN layer by vapor deposition, comprising the steps of:

growing a buffer layer of a III–V compound semiconductor including at least Ga and N on the single crystal GaN layer by vapor deposition; and growing the single crystal AlGaN layer on the buffer layer by vapor deposition.

The buffer layer in the second aspect of the invention is grown at a temperature lower than that for growing the single crystal AlGaN layer.

Typically, vapor deposition used in the first and second aspects of the invention is metallorganic chemical vapor deposition. In this case, temperature for growing the buffer layer is preferably in the range 450° C. to 800° C.

Vapor deposition used in the first and second aspects of the invention may be molecular beam epitaxy.

According to a third aspect of the invention, there is provided a method for growing single crystal III–V compound semiconductor layers, in which a first single crystal III–V compound semiconductor layer including at least Ga and N and a second single crystal III–V compound semi-conductor layer different from the first single crystal III–V compound semiconductor layer and including at least Ga and N are grown on a substrate by vapor deposition, comprising the step of:

growing a buffer layer of a III–V compound semiconductor including at least Ga and N between the first single crystal III–V compound semiconductor layer and the second single crystal III–V compound semiconductor layer.

According to a fourth aspect of the invention, there is provided a method for growing single crystal III–V compound semiconductor layers, in which a single crystal GaN layer and a single crystal AlGaN layer are grown on a sapphire substrate by vapor deposition, comprising the step of:

growing a buffer layer of a III–V compound semiconductor including at least Ga and N between the single crystal GaN layer and the single crystal AlGaN layer.

The invention can be applied to light emitting devices using III–V compound semiconductors of nitrides and to transistors or other devices using III–V compound semiconductors of nitrides.

According to the method according to the first aspect of the invention, the buffer layer other than single crystal and having substantially the same composition as that of the second single crystal III–V compound semiconductor layer is grown on the first single crystal III–V compound semiconductor layer, and the second single crystal III–V compound semiconductor layer is grown on the buffer layer.

Therefore, due to lattice relaxation occurring in the buffer layer, the second single crystal III–V compound semiconductor layer can grow with its own lattice constant on the buffer layer regardless of a large difference in lattice constant between the first and second single crystal III–V compound semiconductor layers.

According to the method according to the second aspect of the invention, the buffer layer other than single crystal and having substantially the same composition as that of the single crystal AlGaN layer is grown on the single crystal GaN layer, and the single crystal AlGaN layer is grown on the buffer layer. Therefore, due to lattice relaxation occurring in the buffer layer, the single crystal AlGaN layer can grow with its own lattice constant on the buffer layer regardless of a large difference in lattice constant between the single crystal GaN layer and the single crystal AlGaN layer.

According to the method according to the third aspect of the invention, the first single crystal III–V compound semiconductor layer and the buffer layer of a III–V compound semiconductor including at least Ga and N are grown on the substrate, and the second single crystal III–V compound semiconductor layer is grown on the buffer layer. Therefore, due to lattice relaxation occurring in the buffer layer, the second single crystal III–V compound semiconductor layer can grow with high quality on the buffer layer regardless of a large difference in lattice constant between the first and second single crystal III–V compound semiconductor layers.

According to the method according to the fourth aspect of the invention, the single crystal GaN layer and the buffer layer of a III–V semiconductor including at least Ga and N are grown on the sapphire substrate, and the single crystal AlGaN layer is grown on the buffer layer. Therefore, due to lattice relaxation occurring in the buffer layer, the single crystal AlGaN layer can grow with high-quality crystallization on the buffer layer regardless of a large difference in lattice constant between the single crystal GaN layer and the single crystal AlGaN layer.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Embodiments of the invention are described below with reference to the drawings.

Figure 1:
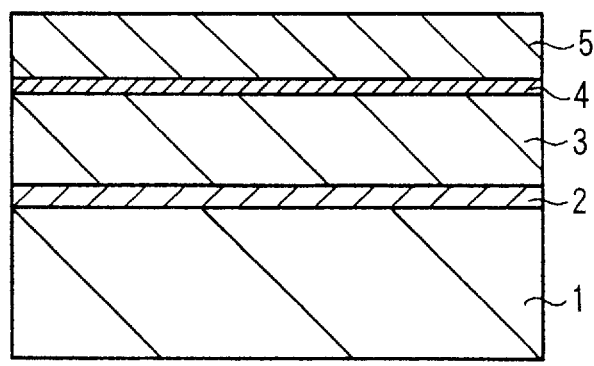
FIG. 1 is a cross-sectional view of a multilayered structure for explaining a first embodiment of the invention.

FIG. 1 shows the first embodiment of the invention in which a GaN/AlGaN heterostructure is formed on a sapphire substrate by metalorganic chemical vapor deposition (MOCVD).

As shown in FIG. 1, a GaN buffer layer 2 is first grown on a c-plane sapphire substrate 1, for example, at the temperature of 560° C. The temperature is then increased to, for example, 1000° C., and a GaN layer 3 is grown on the GaN buffer layer 2. The GaN buffer layer 2 is 30 nm thick, for example, and the GaN layer 3 is 2 μm thick, for example. Usable as source gases for growth of the GaN buffer layer 2 and the GaN layer 3 are, for example, trimethyl gallium (TMG) as source of Ga and ammonia ($NH_3$) as source of N. Usable as carrier gases are, for example, hydrogen ($H_2$) and nitrogen ($N_2$). Supply amounts of these gases are, for example, 130 μmol/minute for TMG, 0.4 mol/minute for $NH_3$, 8 l/minute for $H_2$, and 5 l/minute for $N_2$. By first growing the GaN buffer layer 2 on the c-plane sapphire substrate 1 at a low temperature and next growing the GaN layer 3 on the GaN buffer layer 2 at the temperature of 1000° C., a high quality of the single crystal GaN layer 3 with a mirror surface is promised. This technology is as disclosed by Japanese Patent Laid-Open No. Hei 2-229476 and Japanese Patent Laid-Open No. Hei 4-297023.

After that, while further supplying trimethyl aluminum (TMA), for example, as source of Al in addition to TMG and $NH_3$, and again decreasing the temperature to 560° C., an $Al_{0.15}Ga_{0.85}N$ buffer layer 4 is grown on the GaN layer 3. The $Al_{0.15}Ga_{0.85}N$ buffer layer 4 is 10 nm thick, for example. The supply amount of TMA for growth of the $Al_{0.15}Ga_{0.85}N$ buffer layer 4 is, for example, 30 μmol/minute. The $Al_{0.15}Ga_{0.85}N$ buffer layer 4 grown at the low temperature is considered to be other than single crystal, that is, polycrystal or amorphous, although inheriting the crystallographic orientation of the underlying single crystal GaN layer 3.

Once the supply of TMA and TMG is interrupted, the temperature is elevated to 1000° C., and while supplying the above-used flow amounts of TMA and TMG, an $Al_{0.15}Ga_{0.85}N$ layer 5 is grown on the $Al_{0.15}Ga_{0.85}N$ buffer layer 4. The $Al_{0.15}Ga_{0.85}N$ layer 5 is 1 μm thick, for example. Although GaN and AlGaN are largely different in lattice constant, due to lattice relaxation occurring in the polycrystal or amorphous $Al_{0.15}Ga_{0.85}N$ buffer layer 4, the $Al_{0.15}Ga_{0.85}N$ layer 5 can grow with its own lattice constant on the $Al_{0.15}Ga_{0.85}N$ buffer layer 4. As a result, the single crystal $Al_{0.15}Ga_{0.85}N$ layer 5 as thick as 1 μm can be made.

Figure 2A:
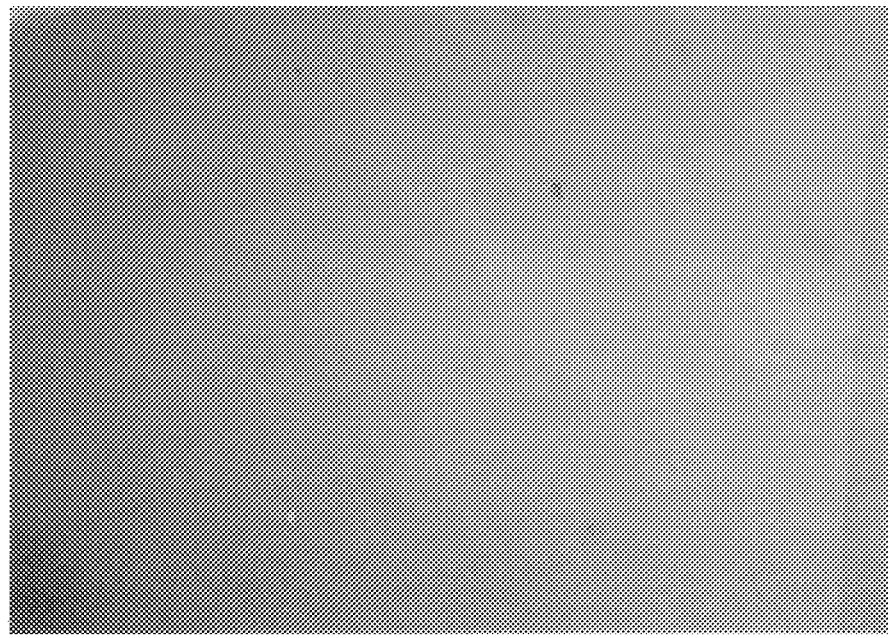
FIGS. 2A and 2B are optical microscopic photographs of a surface of an $Al_{0.15}Ga_{0.85}N$ layer in a GaN/AlGaN heterostructure made by the first embodiment of the invention and a surface of an $Al_{0.15}Ga_{0.85}N$ layer in a GaN/AlGaN heterostructure made by a conventional technique.
Figure 2B:
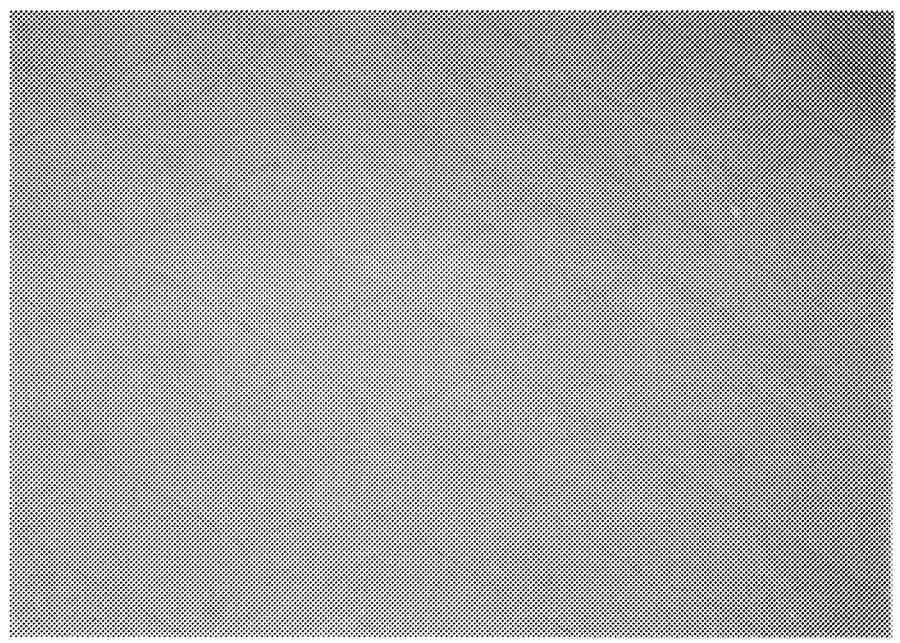

A mirror surface without no cross-hatched pattern was confirmed by observation of the surface of the $Al_{0.15}Ga_{0.85}N$ layer 5, thus obtained, through an optical microscope. An image of the surface of the $Al_{0.15}Ga_{0.85}N$ layer 5 taken by the optical microscope is shown in FIG. 2A. For the purpose of comparison, FIG. 2B shows an optical microscopic image of the surface of an $Al_{0.15}Ga_{0.85}N$ layer 5 grown directly on a c-plane sapphire substrate 1 without interposing an $Al_{0.15}Ga_{0.85}N$ buffer layer 4. A cross-hatched pattern is observed on the surface of the $Al_{0.15}Ga_{0.85}N$ layer 5 of FIG. 2B, which means cracks occur in the $Al_{0.15}Ga_{0.85}N$ layer 5.

According to the first embodiment described above, by first growing the $Al_{0.15}Ga_{0.85}N$ buffer layer 4 other than single crystal on the GaN layer 3 at a low temperature and next growing the $Al_{0.15}Ga_{0.85}N$ layer 5 on the $Al_{0.15}Ga_{0.85}N$ buffer layer 4 at the temperature of 1000° C., for example, a sufficient thickness of the single crystal $Al_{0.15}Ga_{0.85}N$ layer 5 with a high quality and a mirror surface can be grown.

Next explained is the second embodiment of the invention in which a GaN/AlGaN double-heterostructure is made on a sapphire substrate by MOCVD.

Figure 3:
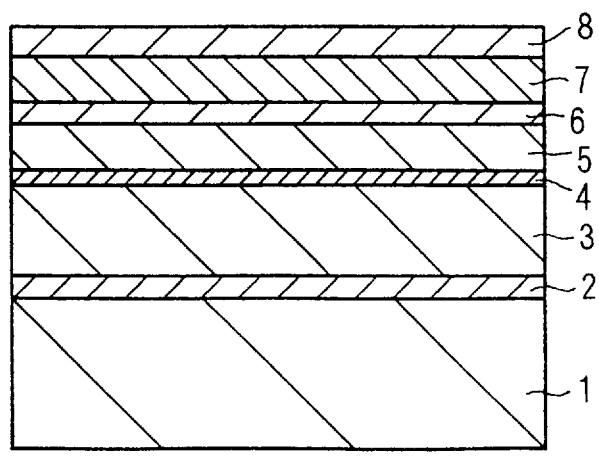
FIG. 3 is a cross-sectional view of a multilayered structure for explaining a second embodiment of the invention.

As shown in FIG. 3, the second embodiment sequentially grows the GaN buffer layer 2, GaN layer 3, $Al_{0.15}Ga_{0.85}N$ buffer layer 4 and $Al_{0.15}Ga_{0.85}N$ layer 5 on the c-plane sapphire substrate 1 in the same manner as the first embodiment. However, the thickness of the $Al_{0.15}Ga_{0.85}N$ layer 5 is 0.5 μm, for example.

Next grown on the $Al_{0.15}Ga_{0.85}N$ layer 5 are a GaN layer 6, $Al_{0.15}Ga_{0.85}N$ layer 7 and GaN layer 8 in sequence at the temperature of 1000° C., for example. Typically, the GaN layer 6 is 30 nm thick, the $Al_{0.15}Ga_{0.85}N$ layer 7 is 0.5 μm thick, and the GaN layer 8 is 100 nm thick.

According to the second embodiment described above, by first growing the $Al_{0.15}Ga_{0.85}N$ layer 4 other than single crystal on the GaN layer 3 at a low temperature and by next growing the $Al_{0.15}Ga_{0.85}N$ layer 5, GaN layer 6, $Al_{0.15}Ga_{0.85}N$ layer 7 and GaN layer 8 in sequence on the $Al_{0.15}Ga_{0.85}N$ layer 4 at the temperature of 1000° C., for example, sufficient thicknesses of high-quality single crystals of the $Al_{0.15}Ga_{0.85}N$ layer 5, GaN layer 6, $Al_{0.15}Ga_{0.85}N$ layer 7 and GaN layer 8 with mirror surfaces can be grown. As a result, a high-quality GaN/AlGaN double heterostructure can be formed and used as an excellent waveguide structure without reflection loss of light.

Next explained is the third embodiment of the invention in which a GaN/GaInN heterostructure is formed on a sapphire substrate by MOCVD.

Figure 4:
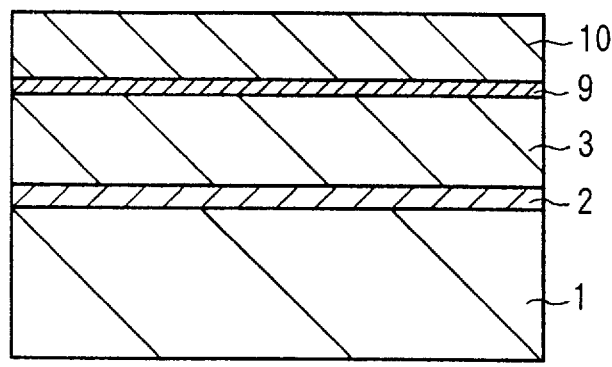
FIG. 4 is a cross-sectional view of a multilayered structure for explaining a third embodiment of the invention.

As shown in FIG. 4, the third embodiment first grows the GaN buffer layer 2 and the GaN layer 3 in sequence on the c-plane sapphire substrate 1 in the same manner as the first embodiment.

Once the supply of TMG and $NH_3$ is interrupted, the temperature is decreased to 560° C., for example, and while supplying trimethyl indium (TMIn), for example, as source of In in addition to TMG and $NH_3$, a $Ga_{0.92}In_{0.08}N$ buffer layer 9 is grown on the GaN layer 3. The $Ga_{0.92}In_{0.08}N$ buffer layer 9 is 15 nm thick, for example. Supply amounts of TMG and TMIn for growth of the $Ga_{0.92}In_{0.08}N$ buffer layer 9 are 13 μmol/minute and 50 μmol/minute, respectively. The $Ga_{0.92}In_{0.08}N$ buffer layer 9 grown at the low temperature is considered to be other than single crystal, that is, polycrystal or amorphous, although inheriting the crystallographic orientation of the underlying single crystal GaN layer 3. .

After that, once the supply of TMG and TMIn is interrupted, the temperature is elevated to 800° C., and while supplying the above-used flow amounts of TMG and TMIn, a $Ga_{0.92}In_{0.08}N$ layer 10 is grown on the $Ga_{0.92}In_{0.08}N$ layer 9. The $Ga_{0.92}In_{0.08}N$ layer 10 is 1 μm thick, for example. Although GaN and GaInN are largely different in lattice constant, due to lattice relaxation occurring in the polycrystal or amorphous $Ga_{0.92}In_{0.08}N$ buffer layer 9, the $Ga_{0.92}In_{0.08}N$ layer 10 can grow with its own lattice constant on the $Ga_{0.92}In_{0.08}N$ buffer layer 9. As a result, the single crystal $Ga_{0.92}In_{0.08}N$ layer 10 as thick as 1 μm can be made.

According to the third embodiment described above, by first growing the $Ga_{0.92}In_{0.08}N$ buffer layer 9 other than single crystal on the GaN layer 3 at a low temperature and by next growing the $Ga_{0.92}In_{0.08}N$ layer 10 on the $Ga_{0.92}In_{0.08}N$ buffer layer 9 at the temperature of 800° C., for example, a sufficient thickness of the $Ga_{0.92}In_{0.08}N$ layer 10 of high-quality single crystal and a mirror surface can be grown.

Next explained is the fourth embodiment of the invention in which an AlGaN/GaInN double heterostructure is formed on a sapphire substrate by MOCVD.

Figure 5:
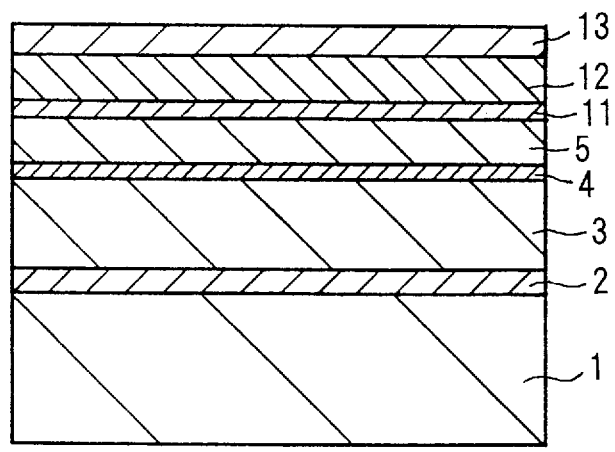
FIG. 5 is a cross-sectional view of a multilayered structure for explaining a fourth embodiment of the invention.

As shown in FIG. 5 the fourth embodiment first grows the GaN buffer layer 2, GaN layer 3, $Al_{0.15}Ga_{0.85}N$ buffer layer 4 and $Al_{0.15}Ga_{0.85}N$ layer 5 in sequence on the c-plane sapphire substrate 1 in the same manner as the first embodiment. However, the $Al_{0.15}Ga_{0.85}N$ layer 5 is 0.5 μm thick, for example.

After that, in the same manner as the third embodiment, a $Ga_{0.92}In_{0.08}N$ layer 11 is grown on the $Al_{0.15}Ga_{0.85}N$ layer 5 at the temperature of 800° C., for example. the $Ga_{0.92}In_{0.08}N$ layer 11 is 15 nm thick, for example.

Once the supply of TMG and TMIn is interrupted, the temperature is increased to 1000° C., for example, and an $Al_{0.15}Ga_{0.85}N$ layer 12 and a GaN layer 13 are grown on the $Ga_{0.92}In_{0.08}N$ layer 11 in the same manner as the $Al_{0.15}Ga_{0.85}N$ layer 7 and the GaN layer 8 of the second embodiment. The $Al_{0.15}Ga_{0.85}N$ layer 12 is 0.5 μm thick, for example, and the GaN layer 13 is 100 nm thick, for example.

According to the fourth embodiment described above, by first growing the $Al_{0.15}Ga_{0.85}N$ buffer layer 4 other than single crystal on the GaN layer 3 at a low temperature and next growing the $Al_{0.15}Ga_{0.85}N$ layer 5, $Ga_{0.92}In_{0.08}N$ layer 11, $Al_{0.15}Ga_{0.85}N$ layer 12 and GaN layer 13 in sequence on the $Al_{0.15}Ga_{0.85}N$ buffer layer 4, sufficient thicknesses of high-quality single crystals of the $Al_{0.15}Ga_{0.85}N$ layer 5, $Ga_{0.92}In_{0.08}N$ layer 11, $Al_{0.15}Ga_{0.85}N$ layer 12 and GaN layer 13 with mirror surfaces can be grown. As a result, a high-quality AlGaN/GaInN double heterostructure can be formed and used as an excellent waveguide structure.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention.

For example, numerical values shown in the first to fourth embodiments are only examples, and may be changed appropriately.

When the invention is applied to fabrication of transistors or other devices, desired movement of carriers is ensured with no cracks in the III–V compound semiconductor layers of nitrides.

As described above, the invention can grow a high-quality single crystal III–V compound semiconductor layer of a nitride with a sufficient thickness on an underlying single crystal III–V compound semiconductor layer of a nitride which is largely different in lattice constant, by the method in which a buffer layer other than single crystal and having substantially the same composition of a second single crystal III–V compound semiconductor layer is first grown on a first single crystal III–V compound semiconductor by vapor deposition, and the second single crystal III–V compound semiconductor layer is next grown on the buffer layer by vapor deposition.

More specifically, the invention can grown a high-quality single crystal AlGaN layer with a desired thickness on an underlying single crystal GaN layer largely different in lattice constant, by the method in which a buffer layer other than single crystal and having substantially the same composition as that of the single crystal AlGaN layer is first grown on the single crystal GaN layer by vapor deposition, and the single crystal AlGaN layer is next grown on the buffer layer by vapor deposition.

What is claimed is:

1. A method for making heterostructure semiconductor comprising the steps of:
   providing a c-plane sapphire substrate having a surface;
   forming a polycrystalline or amorphous GaN buffer layer on the surface by vapor deposition methods at a first temperature of from about 450° to about 800° C.;

forming a single crystal GaN layer on the GaN buffer layer by vapor deposition methods at a second temperature higher than said first temperature;

forming a polycrystalline or amorphous GaInN buffer layer on the single crystal GaN layer by vapor deposition methods at a said first temperature; and thereafter, forming a single crystal GaInN layer on the GaInN buffer layer by vapor deposition methods at a said second temperature to provide said heterostructure semiconductor.

2. A method as defined in claim 1, wherein said vapor deposition methods comprise a metallorganic chemical vapor deposition (MOCVD) method.

3. A method as defined in claim 1, wherein said vapor deposition methods comprise a molecular beam epitaxy (MBE) method.

4. A method as defined in claim 1, wherein said GaInN buffer layer has a thickness of about 15 nm.

5. A method as defined in claim 1, wherein said GaInN single crystal layer has a thickness of about 1 $\mu$m.

6. A method as defined in claim 1, wherein the GaInN buffer layer and the GaInN single crystal layer comprise $Ga_{0.92}In_{0.08}N$.

7. A method for making a double heterostructure semiconductor comprising the steps of:

providing a c-plane sapphire substrate having a surface;

forming a polycrystalline or amorphous GaN buffer layer on the surface by vapor deposition methods at a first temperature of from about 450° to about 800° C.;

forming a first single crystal GaN layer on the GaN buffer layer by vapor deposition methods at a second temperature higher than said first temperature;

forming a polycrystalline or amorphous AlGaN buffer layer on the first single crystal GaN layer by vapor deposition methods at a said first temperature;

forming a first single crystal AlGaN layer on the AlGaN buffer layer by vapor deposition methods at a said second temperature;

forming a single crystal GaInN layer on said first single crystal AlGaN layer by vapor deposition methods at a said second temperature;

forming a second single crystal AlGaN layer on the single crystal GaInN layer by vapor deposition methods at a said second temperature; and thereafter, forming a second single crystal GaN layer on the second single crystal AlGaN layer by vapor deposition methods at a said second temperature to provide said double heterostructure semiconductor.

8. A method as defined in claim 7, wherein said first single crystal AlGaN layer has a thickness of about 0.5 $\mu$m.

9. A method as defined in claim 7, wherein said second single crystal AlGaN layer has a thickness of about 0.5 $\mu$m.

10. A method as defined in claim 7, wherein said second single crystal GaN layer has a thickness of about 100 nm.

11. A method as defined in claim 7, wherein the AlGaN buffer layer and the first and the second single crystal AlGaN layers comprise $Al_{0.15}Ga_{0.85}N$.

12. A method as defined in claim 7, wherein the single crystal GaInN layer comprises $Ga_{0.92}In_{0.08}N$.

* * * * *